US005682321A

United States Patent [19]
Ding et al.

[11] Patent Number: 5,682,321
[45] Date of Patent: Oct. 28, 1997

[54] CELL PLACEMENT METHOD FOR MICROELECTRONIC INTEGRATED CIRCUIT COMBINING CLUSTERING, CLUSTER PLACEMENT AND DE-CLUSTERING

[75] Inventors: Cheng-Liang Ding, San Jose, Calif.; Ting-Chi Wang, Taipei, Taiwan; Mary Jane Irwin, Spring Mills, Pa.

[73] Assignee: LSI Logic Corporation, Milpitas, Calif.

[21] Appl. No.: 318,275

[22] Filed: Oct. 5, 1994

(Under 37 CFR 1.47)

[51] Int. Cl.$^6$ .................................................. G06F 17/50
[52] U.S. Cl. .......................... 364/490; 364/491; 395/500; 257/208; 326/41
[58] Field of Search ........................ 395/500, 921; 364/488, 489, 490, 491; 257/210, 211, 203, 208; 326/41, 38, 101; 437/51

[56] References Cited

U.S. PATENT DOCUMENTS

| | | | |
|---|---|---|---|
| 5,140,402 | 8/1992 | Murakata | 357/45 |
| 5,222,031 | 6/1993 | Kaida | 364/491 |
| 5,224,056 | 6/1993 | Chene et al. | 364/490 |
| 5,224,057 | 6/1993 | Igarashi et al. | 364/490 |
| 5,341,308 | 8/1994 | Mendel | 364/489 |

OTHER PUBLICATIONS

C. Ding, C. Ho and M.J. Irwin, "A New Optimization Driven Clustering Algorithm for Large Circuits," *ACM/SIGDA Physical Design Workshop*, pp. 13–19, Sep. 1993.

C. Fiduccia and R. Mattheyses, "A Linear–Time Heuristic For Improving Network Partitions," *DAC*, pp. 175–181, Jun. 1982.

J. Garbers, H.J. Promel and A. Stenger, "Finding Clusters in VLSI Circuits," *ICCAD*, pp. 520–523, Nov. 1990.

L. Hagen and A.B. Kahng, "New Spectral Methods for Ratio Cut Partitioning and Clustering," *UCLA CS Dept. TR–019973*, Oct. 1991.

J.M. Kleinhans, G. Sigl, F.M. Johannes and K.J. Antreich, "Gordian: VLSI Placement by Quadratic Programming and Slicing Optimization," *IEEE Trans. on CAD*, pp. 356–365, Mar. 1991.

B.W. Kernighan and S. Lin, "An Efficient Heuristic Procedure for Partitioning Graphs," *Bell Systems Technical Journal*, 49(2), pp. 291–307, Feb. 1970.

U. Lauther, "A Min–Cut Placement Algorithm for General Cell Assemblies Based on a Graph Representation," *DAC*, pp. 1–10, Jun. 1976.

T. Lengauer, *Combinatorial Algorithms for Integrated Circuit Layout*, J. Wiley, 1990.

R.M. Ling and P. Banerjee, "Optimization by Simulated Evolution with Application to Standard Cell Placement," *DAC*, pp. 20–25, Jun. 1990.

(List continued on next page.)

*Primary Examiner*—Kevin J. Teska
*Assistant Examiner*—Tan Nguyen
*Attorney, Agent, or Firm*—Oppenheimer Poms Smith

[57] ABSTRACT

A large number of microelectronic circuit cells that are interconnected by a set of wiring nets are optimally placed on an integrated circuit chip such that all interconnects can be routed and the total wirelength of the interconnects is minimized. Cells are first grouped into disjoint clusters by an optimization-driven clustering technique, which uses both local and global connectivity information among the cells. This technique uses Rent's rule for combining pairs of neighboring clusters, and selects among pairs of clusters having the same Rent's exponent using distance information derived from global optimization processing. Clusters are prevented from growing to an excessive size by limiting the number of cells per cluster and the maximum area per cluster to predetermined maximum values. After the clusters are generated, they are placed using an optimization-driven placement technique, preferably "Gordian". Finally, the cells within each cluster are de-clustered and locally placed using a partitioning technique, preferably "min-cut".

24 Claims, 5 Drawing Sheets

OTHER PUBLICATIONS

Mallela and L.K. Grover, "Clustering Based Simulated Annealing for Standard Cell Placement," *DAC*, pp. 312–317, Jun. 1988.

T. Ng, J. Oldfield and V. Pitchumani, "Improvements of a Mincut Partition Algorithm," *ICCAD*, pp. 470–473, Nov. 1987.

B. Preas and M. Lorenzetti, *Physical Design Automation of VLSI Systems*, Benjamin/Cummings, 1988.

C. Sechen and K.W. Lee, "An Improved Simulated Annealing Algorithm for Row–Based Placement," *ICCAD*, pp. 4578–481, Nov. 1987.

R.S. Tsay, E.S. Kuh and C.P. Hsu, "Proud: a Fast Sea–of–Gate Placement Algorithm," *DAC*, pp. 318–323, Dec. 1988.

CELL PLACEMENT METHOD FOR MICROELECTRONIC INTEGRATED CIRCUIT COMBINING CLUSTERING, CLUSTER PLACEMENT AND DE-CLUSTERING

BACKGROUND OF THE INVENTION

1. Field of the Invention

The present invention generally relates to the art of microelectronic integrated circuits, and more specifically to a cell placement method for designing an integrated circuit combining clustering, cluster placement and de-clustering.

2. Description of the Related Art

Microelectronic integrated circuits consist of large numbers of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design. It is an extremely tedious and an error-prone process because of the tight tolerance requirements and the minuteness of the individual components.

Currently, the minimum geometric feature size of a component is on the order of 0.5 microns. However, it is expected that the feature size can be reduced to 0.1 micron within several years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Each microelectronic circuit device or cell includes a plurality of pins or terminals, each of which is connected to pins of other cells by a respective electrical interconnect wire network or net. A goal of the optimization process is to determine a cell placement such that all of the required interconnects can be made, and the total wirelength and interconnect congestion are minimized.

As illustrated in FIG. 1, a conventional microelectronic integrated circuit 10 comprises a substrate 12 on which a large number of microelectronic circuits are formed. These circuits include large functional macroblocks such as indicated at 14 which may be central processing units, input-output devices or the like. A typical integrated circuit further comprises a large number of cells 16 that are arranged in a generally rectangular pattern in the areas of the substrate 12 that are not occupied by macroblocks.

The cells 16 may comprise individual logic gates, or more preferably may each comprise a plurality of logic gates that are interconnected to form functional blocks. Typically, a cell library consisting of standardized cells that perform desired logical operations are provided and are combined with other cells to form an integrated circuit having the desired functionality.

The cells 16 have terminals 18 to provide interconnections to other cells 16 on the substrate 12. Interconnections are made via vertical electrical conductors 20 and horizontal electrical conductors 22 that extend between the terminals 18 of the cells in such a manner as to achieve the interconnections required by the netlist of the integrated circuit 10. It will be noted that only a few of the elements 16, 18, 20 and 22 are designated by reference numerals for clarity of illustration.

Cell placement is an important step in VLSI layout design. Cell placement techniques in general can be divided into two categories, i.e., constructive techniques and iterative improvement techniques. Partitioning and analytical approaches are the most often used methods in constructive techniques. The iterative improvement techniques must have an initial placement (which can be generated by a constructive technique) as the input, and then iteratively improves the results based on the given initial placement until no further improvement can be achieved within certain amount of time. Simulated evolution and simulated annealing are the two most often used approaches in the iterative improvement techniques.

Clustering can play a very useful role in helping improve the placement results generated by either constructive or iterative improvement techniques. Its main purpose is to group highly connected cells into disjoint clusters as early as possible such that the cells in each cluster will not be later placed too far away from each other.

Most of the existing clustering techniques have the drawback of either not being able to properly control the size of a cluster or only capturing local connectivity information among the cells. A typical clustering technique of this type is known as "Rent's Rule", and is disclosed per se in an article entitled "Improvements of A Mincut Partition Algorithm", by T. Ng et al, ICCAD, 1987, pp. 470–473.

An optimization-driven clustering technique which captures both global and local connectivity with the consideration of properly controlling the growth rate of a cluster is described in an article entitled "A New Optimization Driven Clustering Algorithm for Large Circuits, by C. Ding et al, in ACM/SIGDA Physical Design Workshop, 1993, pp. 13–19. This technique uses global optimization to identify global connectivity, and uses Rent's Rule to identify local connectivity.

An optimization-driven placement technique is described in an article entitled "Gordian: VLSI Placement by Quadratic Programming and Slicing Optimization", by J. Kleinhans et al, IEEE Trans. on CAD, 1991, pp. 356–365. Kleinhans uses a min-cut partitioning technique as described per se in an article entitled "An Efficient Heuristic Procedure for Partitioning Graphs", by B. Kernighan and S. Lin, in Bell Systems Technical Journal, 49(2), 1070, pp. 291–307.

An improved version of the min-cut technique is described in an article entitled "A Linear-Time Heuristic for Improving Network Partitions", by C. Fiduccia and R. Mattheyses, DAC, 1982, pp. 175–181. This technique is known in the art as "KLFM", which is an acronym derived from the first letters of the last names of the authors of the two above referenced articles, Kernighan, Lin, Fiduccia and Mattheyses.

A major drawback of the KLFM technique is that it is order-dependent, such that the order in which cells are encountered by the technique affects the resultant partitioning.

SUMMARY OF THE INVENTION

The present invention provides a cell placement method which combines bottom-up (clustering) and top-down (partitioning plus analytical) techniques.

In accordance with the present method, a large number of microelectronic circuit cells that are interconnected by a set of wiring nets are optimally placed on an integrated circuit chip such that all interconnects can be routed and the total wirelength of the interconnects is minimized.

Cells are first grouped into disjoint clusters by an optimization-driven clustering technique, which uses both local and global connectivity information among the cells. This technique uses Rent's Rule for combining pairs of neighboring clusters, and selects among pairs of clusters having the same Rent's exponent using distance information derived from global optimization processing.

After the clusters are generated, they are placed by an optimization-driven placement technique, preferably "Gordian". Clusters are prevented from growing to an excessive size by limiting the number of cells per cluster and the maximum area of a cluster to predetermined maximum values.

Finally, the cells within each cluster are de-clustered and locally placed using a partitioning technique, preferably "min-cut".

These and other features and advantages of the present invention will be apparent to those skilled in the art from the following detailed description, taken together with the accompanying drawings, in which like reference numerals refer to like parts.

DETAILED DESCRIPTION OF THE INVENTION

A method of cell placement for a microelectronic integrated circuit in accordance with the present invention is illustrated in FIGS. 2, 3 and 4a to 4c.

In general, the set of cells in the cell placement problem is divided into three disjoint sets, I, J, and K, where I is the set of all input-output (I/O) cells, J is the set of all pre-placed non-I/O cells, and K is the set of all unplaced non-I/O cells. Each cell in I is required to be pre-placed.

Each cell in I∪J will be treated as a fixed cell, and its location will not be changed during placement. Each cell in K is treated as a movable cell, and its location will be determined by the placement method. The size (i.e., the dimensions) of the chip is also given as part of the input.

The objective of the placement problem is to determine a location for each movable cell such that the resulting routability of the chip is as high as possible. Since the size of the chip is fixed at the beginning, the resulting routability will be measured by the number of open nets (a net is considered to be open if it cannot be completely routed) that remain after detailed routing is done. The output of the present placement method is a point placement, such that overlapping among cells is allowed. However, overlapping can be resolved later using a technology-dependent placement tool, and hence is not a concern of the present invention.

Figure 1:
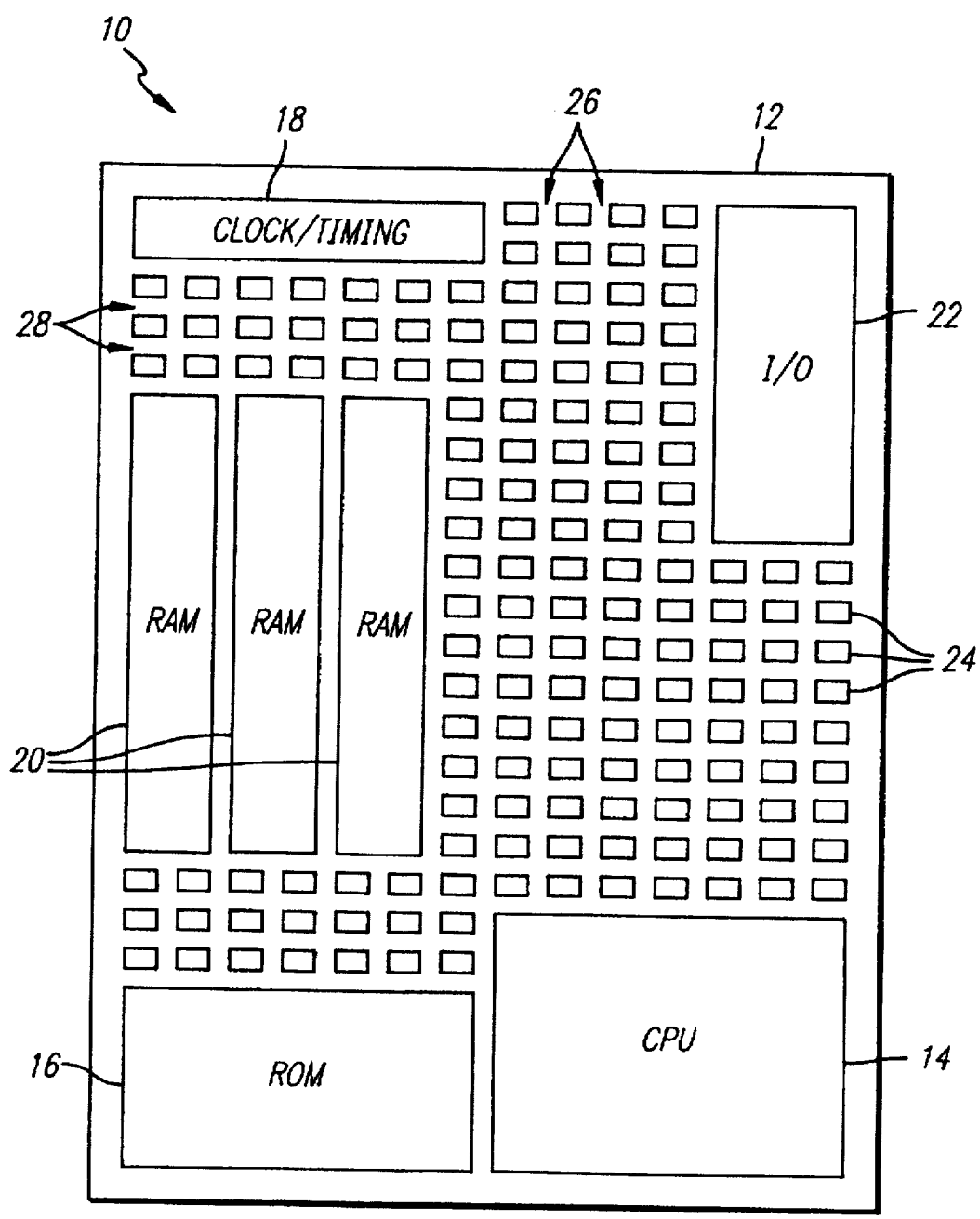
FIG. 1 is a simplified diagram illustrating an integrated circuit chip which can be optimally designed in accordance with the present invention.
Figure 2:
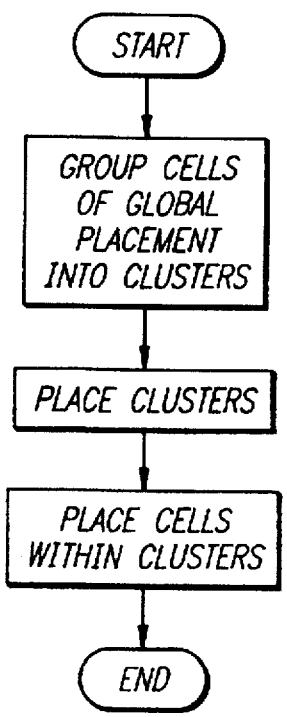
FIG. 2 is a flowchart which generally illustrates a cell placement method according to the present invention combining clustering, cluster placement and de-clustering steps.

An overview of the present method is illustrated in flowchart form in FIG. 2, and is a constructive methodology that exploits bottom-up (clustering) and top-down (partitioning plus analytical) techniques in combination.

The present method itself comprises three major steps.

Step 1: Clustering

The clustering step groups the set K of movable cells of a global placement produced by an optimization-driven technique into disjoint clusters based on their connectivity information. The purpose of clustering is to early identify the strongly connected cells and group them into the same cluster. Those cells in the same cluster will be kept together all the time during the subsequent cluster placement step, and hence they will not be placed too far away from each other in the de-clustering step.

The clustering step preferably comprises the optimization-driven technique described in the above referenced article to Ding et al, which is incorporated herein by reference.

Figure 3:
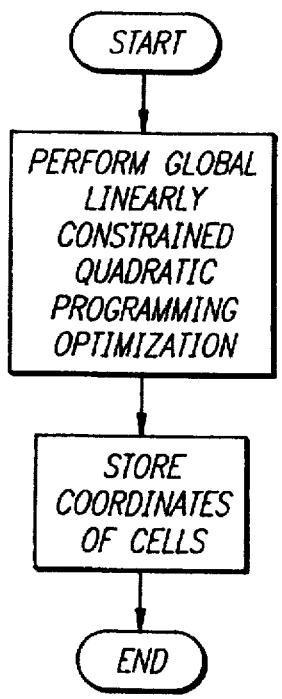
FIG. 3 is a flowchart which generally illustrates a global optimization-driven technique of the clustering step of the method of FIG. 2.

As illustrated in FIG. 3, a global constructive placement is generated using linearly constrained optimization-driven programming, and the coordinates of the cells of the global placement are stored. This constitutes a predetermined global function of the interconnections of the cells as defined by their interconnect nets.

Although the resulting placement may create overlapping among the cells, it can roughly indicate the overall adjacency relation among the cells. Therefore, the distance between cells can be used as a measure of global connectivity.

By denoting dist(c,d) as the distance between cells c and d, the distance between any two clusters, say C and D, is defined as $$\text{dist}(C,D) = \max\{\text{dist}(c,d) | \forall c \in C, \forall d \in D\}$$

Figure 4A:
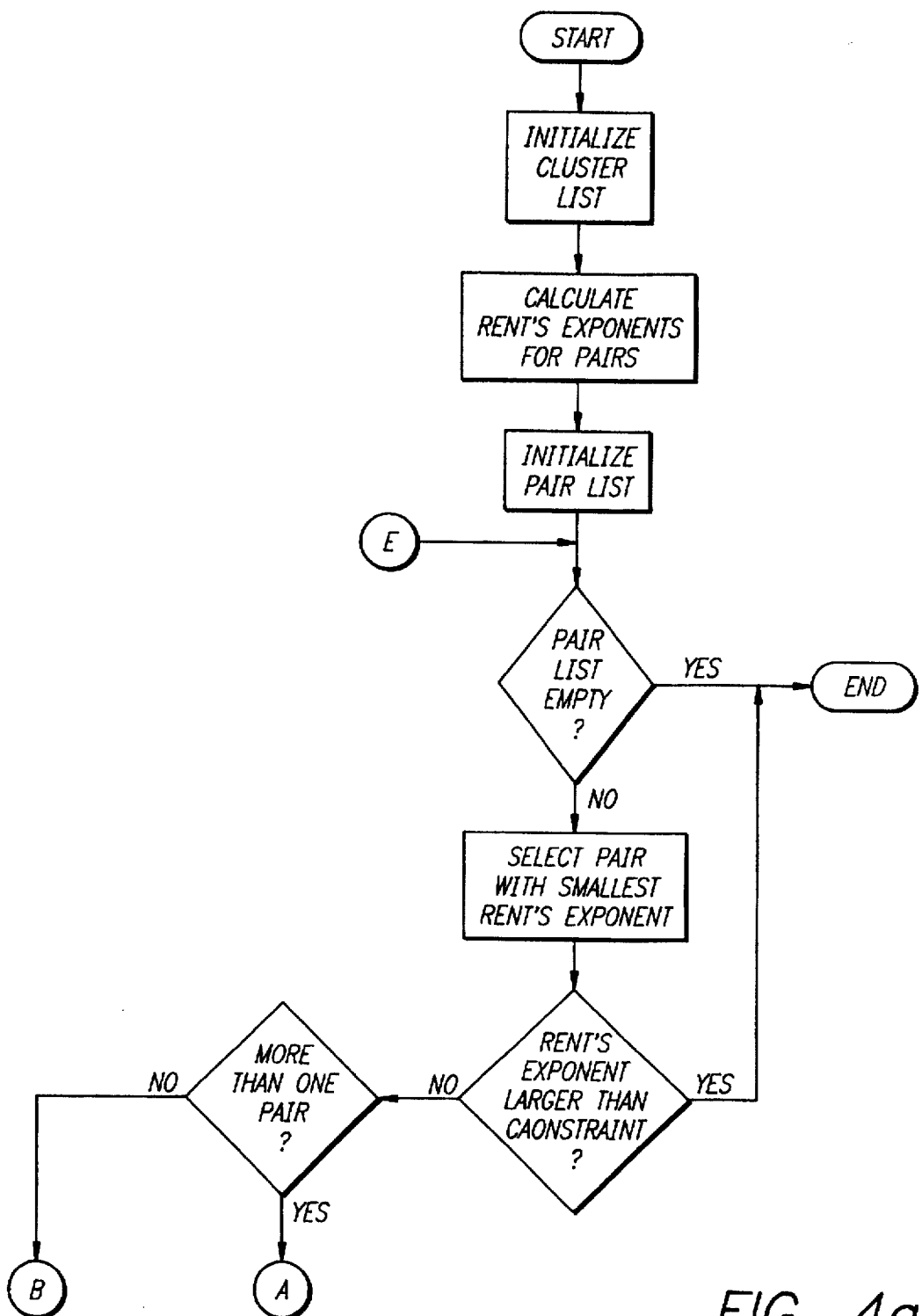
FIGS. 4a to 4c in combination constitute a flowchart illustrating how clustering is performed using Rent's Rule and global information derived from the global optimization-driven technique of FIG. 3.
Figure 4B:
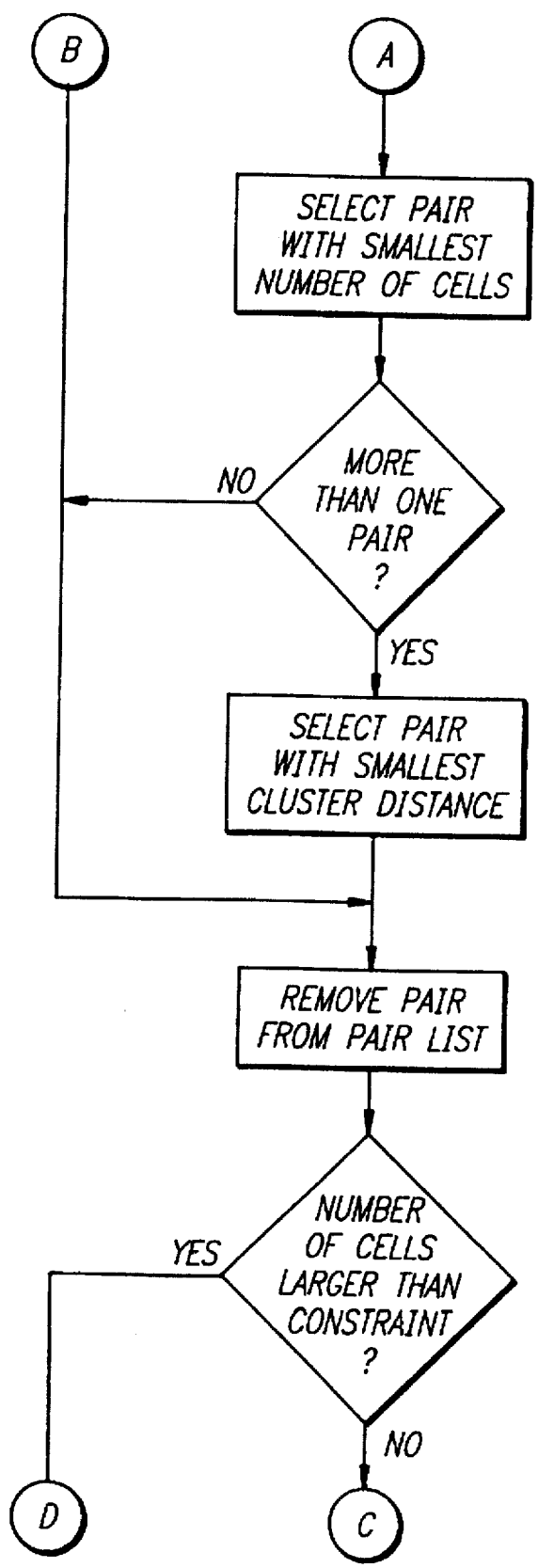
Figure 4C:
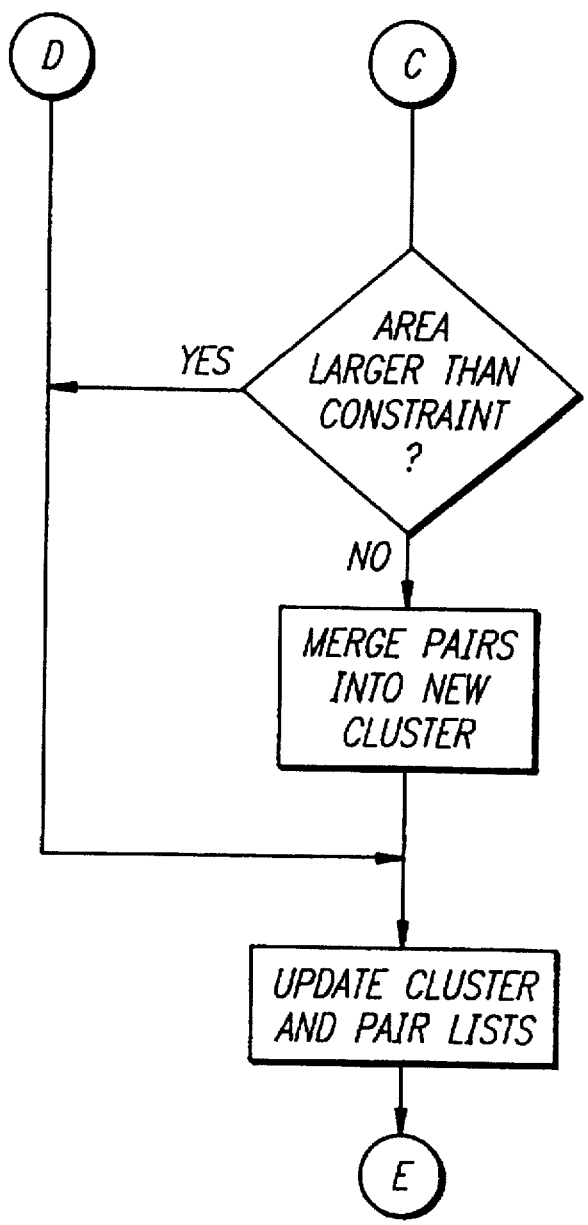

The second technique of the clustering step is illustrated in FIGS. 4a to 4c, and uses a modified form of Rent's rule as described in the Ding et al article to actually group the set of movable cells into disjoint clusters. This constitutes a predetermined local function of the interconnections of the cells as defined by their interconnect nets.

For each cluster C, let T(C) be the total number of pins in the cluster, let E(C) be the total number of nets that have at least one corresponding pin not in the cluster, and let B(C) be the total number of movable cells in the cluster. The approximate Rent's exponent r(C) is calculated by the following equation:

$$r(C) = 1 + \ln(E(C)/T(C))/\ln(B(C))$$

Based on the approximate Rent's exponent, clustering is performed using an iterative greedy technique.

At the beginning, each movable cell itself forms a cluster. Then, at each iteration, the greedy technique reduces the total number of clusters by one by merging a pair of neighboring clusters into a larger cluster (a pair of clusters is defined as "neighboring" if they have at least one common interconnect net).

Step 2: Cluster Placement

This step places the clusters generated in Step 1 using an optimization-driven placement technique, preferably the Gordian as described in the above referenced article to Kleinhans which is incorporated herein by reference. The Gordian technique combines optimization-driven placement with min-cut partitioning as described above.

Step 3: De-clustering

This step utilizes partitioning to locally place cells within the regions previously assigned to their corresponding clusters. The preferred technique for performing the de-clustering step is the improved min-cut methodology which is described in the above referenced article to Fiduccia and Mattheyses which is incorporated herein by reference.

The global optimization technique of the clustering Step 1 as illustrated in FIG. 2 operates by attempting to minimize the value of an "objective function." The objective function of the global optimization process is related to the total wirelength of an integrated circuit design. The unit of the wirelength is the square of the euclidean distance. Each net is modelled as a "clique" (all two-point connections of the pins of the nets), and it is assumed that the final routing is a spanning tree connection.

For example, if a net has "p" pins, and the weight of the net is "w", then the number of edges under global optimization is equal to:

$$\frac{p(p-1)}{2}$$

and the weight of each edge is equal to:

$$\frac{2w}{p}$$

Based on this formulation, the total wirelength $L_i$ of net i is:

$$L_i = w_i \Sigma((x_v + \xi_{iv} - X_u - \xi_{iu})^2 + (y_v + \eta_{iv} - y_u - \eta_{iu})^2)$$

where $\xi_{iv}$ and $\eta_{iv}$ are the x and y coordinates respectively of a pin connected to a net "i" relative to the center coordinates $(x_v, y_v)$ of a module "v" in which the pin is located.

Similarly, $\xi_{iu}$ and $\eta_{iu}$ are the x and y coordinates respectively of a pin connected to a net "i" relative to the center coordinates $(x_u, y_u)$ of a module "u" in which the pin is located.

The total wirelength $\Phi$ of the design can be written in matrix form as:

$$\phi(x_1 y) = X^T C x + 2d^T_x X + y^T C y + 2d^T_y Y$$

The vectors x and y denote the coordinates of all movable cells of the set K. The matrix C is positive definite if all movable modules are connected to fixed modules either directly or indirectly. Since $\Phi(x_1 y)$ is separable, it can be expressed as follows:

$$\Phi(x, y) = \Phi(x) + \Phi(y)$$

Directing attention to the part of the objective function which depends on x coordinates results in the following:

$$\Phi(x) = x^T C x + 2d^T X$$

where $d = d_x$.

The constraint of $\Phi(x)$ puts the center of gravity at the center of the core region (placement region considered by the global optimization process). Let the x-coordinate of the center of the core region be $u_x$, then the constraint can be written in matrix form:

$$Ax = u_x$$

where the matrix A captures the size ratio of all movable modules. Finally, the linearly constrained quadratic programming problem (LQP) can be written as:

$$LQP: \min\{\phi(x) = X^T C x + 2d^T x |_{Ax} = u_x\}$$

Since $\Phi(x)$ is a convex function (C is positive definite), the solution of the LQP has a unique global minimum. This problem can be solved very efficiently by doing pre-conditioning on the conjugate gradient method.

Rent's rule is actually an empirical formula which describes the general property of a design with moderate size, and is preferably employed in the clustering Step 1 of the present method as illustrated in the flowchart of FIGS. 4a to 4c.

Rent's rule is expressed as follows:

$$E = \bar{p} x B^r$$

where r is Rent's exponent, E is the number of external pins of a cluster, $\bar{p}$ is the average number of pins per cell, and B is the number of cells in the cluster.

Letting $\bar{T}$ be the average number of pins in a cluster, and manipulating E and $\bar{T}$, the following equation results:

$$r = 1 + \frac{\ln(E/T)}{\ln(B)}$$

or $$r \approx 1 + \frac{\ln(E/T)}{\ln(B)}$$

where T is the total number of pins in a cluster. By using the total number of pins in a cluster, rather than the average, a "greedy" approximation of the Rent's exponent results. The Rent's exponent (r) is, in effect, a figure-of-merit for clusters which is lowest for clusters having large numbers of cells and a small number of external "pins" relative to the total number of "pins" on the cells within the cluster.

A low Rent's exponent implies that the cluster has a relatively high degree of internal connectivity and a relatively low degree of external connectivity, indicating a good clustering choice.

According to the invention, the projected Rent's exponent is computed for every pair of neighboring clusters (based upon a projected merging of the pair). Each neighboring pair of clusters is a candidate for a merge into a single cluster. The smaller the Rent's exponent, the more desirable it is to merge the pair of clusters.

All neighboring pairs of cells that are candidates for merging are considered in ascending order of Rent's exponent. However, in a practical application comprising many thousands of cells, there will probably be a number of pairs of clusters that have approximately the same Rent's exponent.

In this case, the pairs of clusters having the smallest combined number of cells is selected for merging. If more than one pair has the same number of cells, the global information provided by the optimization-driven placement is used as a "tie-breaker". The distances between the clusters of the pairs are calculated, and the pair of clusters having the smallest distance is selected for merging.

With this approach, larger clusters tend to grow even larger, because they have more pins, i.e., they have more common signals with other clusters. In response to this, the present method imposes three constraints to prevent the excessive growth of any cluster.

The first constraint places an upper bound on the number of cells in a cluster. The second constraint places an upper bound on the Rent's exponent of any proposed merged pair of clusters, and prevents loosely coupled (not very heavily interconnected) clusters from merging together to form a large cluster. The third constraint places an upper bound on the total area of a cluster.

The Rent's rule technique of the clustering Step 1 of the present method will be described in more detail with reference to the flowchart of FIGS. 4a to 4c.

First, a "cluster list" containing all clusters of cells of the global optimization-driven placement which was generated as described with reference to FIG. 3 is initialized by designating each cell as a cluster. The Rent's exponents are then calculated for each neighboring pair of clusters (in this case cells) that are interconnected by at least one interconnect net.

Then, a "pair list" is initialized by sorting all neighboring pairs of clusters in ascending order of Rent's exponent, and storing the pairs together with their Rent's exponents as initial entries in the pair list.

The main loop of the flowchart begins at a point E, in which the pair list is examined to determine if any entries remain. If not, indicating that all pairs of clusters that are candidates for merging have been processed, the operation terminates as indicated at END.

If any pairs remain in the pair list, the pair having the lowest Rent's exponent is selected for merging into a single cluster. If only one pair has this value of Rent's exponent, the process branches as indicated at B to a step in which the pair is removed from the pair list.

It is then determined if the Rent's exponent of the pair is larger than a predetermined value $r_{max}$. If so, indicating the level of connectivity of the remaining clusters is insufficient to justify further clustering, the operation terminates at END. If not, the operation continues.

If more than one pair has the same Rent's exponent, a branch A is taken in which the pair having the smallest number of cells is selected for merging. If two or more pairs have the same number of cells, the tie is broken using the global optimization-driven placement information by calculating the distances between the clusters of the pairs, and selecting the pair having the smallest distance between the clusters thereof.

In each case, the selected pair is removed from the pair list. It is then determined whether the pair is within the constraints described above. First, it is determined if the combined number of cells of the two clusters of the pair is larger than a predetermined value $N_{max}$. If so, the clusters are not merged.

If not, it is then determined if the area of the two clusters of the pair, as combined, is larger than another predetermined value $A_{max}$ which is equal to $A_{max}=N_{max} \times A_{av}$, where $A_{av}$ is the average area of the cells of the placement. If so, the clusters are not merged.

If not, the pair of clusters are merged to produce a single larger cluster, the cluster and pair lists are updated, and the operation branches to the main part of the loop at E.

After completion of the clustering operation, steps of cluster placement, and cell placement within the clusters are performed. The preferred method of performing the cluster placement step is the Gordian technique as described above, although the invention is not so limited. The clusters are then partitioned, preferably using the min-cut technique, such that all movable cells are placed within the respective clusters.

EXAMPLE

The present method was implemented in the C programming language on a Sun SPARC station 10. The maximum number of cells in a cluster (i.e., $N_{max}$) was set to 5, and the maximum approximate Rent's exponent (i.e., $r_{max}$) is set to 0.8. Six large real-world circuits were used to test the method as implemented. Table 1 gives the detailed information on the six circuits.

To test the efficiency and effectiveness of the present method, it was compared with the results of using the Gordian technique on the same circuits. Table 2 tabulates the run times for these two methods. As shown in Table 2, the present method consistently ran faster than Gordian by a reduction rate of up to 91%.

To measure the effectiveness of the present method, a layout system provided at LSI Logic Corporation of Milpitas, Calif. was used to measure the number of open nets remaining after detailed routing. A technology-dependent placement tool was used to generate a valid placement (i.e., without overlapping cells) based on the placement results generated by the present method and the Gordian technique. The same global router and detailed router were then used to route the interconnects of the nets.

The detailed router comprised a channel router followed by an area router. The area router attempts to connect any open nets left by the channel router. Table 3 tabulates the number of open nets discovered by the channel router, and Table 4 gives the number of open nets discovered by the area router. In both cases, the present method produces a smaller number of open nets than the Gordian. The reduction rate was as high as 42%.

TABLE 1

| CIRCUIT STATISTICS | | | |
|---|---|---|---|
| Design | # of nets | # of fixed cells | # of movable cells |
| A | 18039 | 510 | 17699 |
| B | 18380 | 881 | 13487 |
| C | 18203 | 655 | 15915 |
| D | 31039 | 292 | 26813 |
| E | 33456 | 968 | 23967 |
| F | 44610 | 856 | 35888 |

TABLE 2

| RUN TIMES (IN SECONDS) | | | |
|---|---|---|---|
| Design | Gordian | Invention | Reduction Rate |
| A | 1782 | 613 | 66% |
| B | 3635 | 342 | 91% |
| C | 1208 | 643 | 47% |
| D | 3120 | 1754 | 44% |
| E | 1602 | 1277 | 23% |
| F | 28140 | 3036 | 89% |

TABLE 3

OPEN NETS DISCOVERED BY CHANNEL ROUTER

| Design | Gordian | Invention | Reduction Rate |
| --- | --- | --- | --- |
| A | 864 | 637 | 26% |
| B | 957 | 712 | 26% |
| C | 5371 | 4212 | 22% |
| D | 3831 | 3013 | 21% |
| E | 6254 | 4505 | 28% |
| F | 7323 | 5979 | 20% |

TABLE 4

OPEN NETS DISCOVERED BY AREA ROUTER

| Design | Gordian | Invention | Reduction Rate |
| --- | --- | --- | --- |
| A | 516 | 297 | 42% |
| B | 513 | 299 | 42% |
| C | 4666 | 3466 | 26% |
| D | 2805 | 1822 | 35% |
| E | 4740 | 2814 | 41% |
| F | 5878 | 4415 | 25% |

Although the present method can be advantageously and specifically utilized to produce an optimal placement of microelectronic cells on an integrated circuit chip, the invention is not so limited, and can be utilized to produce optimal placements of other objects that are interconnected in a predetermined manner.

Various modifications will become possible for those skilled in the art after receiving the teachings of the present disclosure without departing from the scope thereof.

We claim:

1. A method of cell placement for a microelectronic circuit including a plurality of cells and interconnections between said cells, comprising the steps of:

(a) grouping said cells into clusters using an optimization-driven technique including a predetermined local function of said interconnections and a predetermined global function of said interconnections;

(b) placing said clusters using a global optimization and partitioning technique; and (c) placing said cells within said clusters using a partitioning technique.

2. A method according to claim 1, in which said global optimization and partitioning technique in step (b) comprises the substep of:

(d) globally placing said clusters using linearly constrained quadratic programming; and said partitioning technique in step (c) comprises the substep of:

(e) locally placing said clusters using min-cut partitioning.

3. A method according to claim 1, in which the global optimization and partitioning technique in step (b) comprises the "Gordian" technique.

4. A method according to claim 1, in which the partitioning technique of step (c) comprises min-cut partitioning.

5. A method as in claim 1, in which said predetermined global function in step (a) comprises linearly constrained quadratic programming.

6. A method according to claim 5, in which said predetermined local function in step (a) comprises merging pairs of clusters in accordance with Rent's Rule.

7. A method according to claim 6, in which step (a) comprises the substeps of:

(d) selecting pairs of clusters for merging in ascending order of Rent's exponent; and (e) when more than one pair of clusters has substantially the same Rent's exponent, selecting the pair having the smallest number of cells.

8. A method according to claim 7, in which step (a) further comprises the substep, following step (e), of:

(f) when said more than one pair of clusters has substantially said same Rent's exponent and the same number of cells, selecting the pair having the smallest distance between their clusters.

9. A method according to claim 6, in which step (a) further comprises, when more than one pair of clusters has substantially the same Rent's exponent, selecting the pair having the smallest distance between their clusters.

10. A method according to claim 6, in which step (a) further comprises merging only pairs of clusters having Rent's exponents that are smaller than a predetermined value.

11. A method as in claim 6, in which step (a) comprises merging only pairs of clusters that have combined numbers of cells that are smaller than a predetermined value.

12. A method as in claim 6, in which step (a) comprises merging only pairs of clusters having combined areas that are smaller than a predetermined value.

13. A method determining an optimal placement for a plurality of objects having predetermined interconnections therebetween, comprising the steps of:

(a) grouping said objects into clusters using an optimization-driven technique including a predetermined local function of said interconnections and a predetermined global function of said interconnections;

(b) placing said clusters using a global optimization and partitioning technique; and (c) placing said objects within said clusters using a partitioning technique.

14. A method according to claim 13, in which said global optimization and partitioning technique in step (b) comprises the substep of:

(d) globally placing said clusters using linearly constrained quadratic programming; and said partitioning technique in step (c) comprises the substep of:

(e) locally placing said clusters using rain-cut partitioning.

15. A method according to claim 13, in which the global optimization and partitioning technique in step (b) comprises the "Gordian" technique.

16. A method according to claim 13, in which the partitioning technique of step (c) comprises min-cut partitioning.

17. A method as in claim 13, in which said predetermined global function in step (a) comprises linearly constrained quadratic programming.

18. A method according to claim 17, in which said predetermined local function in step (a) comprises merging pairs of clusters in accordance with Rent's Rule.

19. A method according to claim 18, in which step (a) comprises the substeps of:

(d) selecting pairs of clusters for merging in ascending order of Rent's exponent; and (e) when more than one pair of clusters has substantially the same Rent's exponent, selecting the pair including the smallest number of objects.

20. A method according to claim 19, in which step (a) further comprises the substep, following step (e), of:

(f) when said more than one pair of clusters has substantially said same Rent's exponent and the same number of objects, selecting the pair having the smallest distance between their clusters.

21. A method according to claim 18, in which step (a) further comprises, when more than one pair of clusters has substantially the same Rent's exponent, selecting the pair having the smallest distance between their clusters.

22. A method according to claim 18, in which step (a) comprises merging only pairs of clusters having Rent's exponents that are smaller than a predetermined value.

23. A method as in claim 18, in which step (a) comprises merging only pairs of clusters that have combined numbers of objects that are smaller than a predetermined value.

24. A method as in claim 18, in which step (a) comprises merging only pairs of clusters having combined areas that are smaller than a predetermined value.

* * * * *